(12) United States Patent
Bhatia et al.

(10) Patent No.: US 7,457,998 B1
(45) Date of Patent: Nov. 25, 2008

(54) SCAN REGISTER AND METHODS OF USING THE SAME

(75) Inventors: Sandeep Bhatia, San Jose, CA (US); Oriol Roig, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 547 days.

(21) Appl. No.: 11/033,059

(22) Filed: Jan. 7, 2005

(51) Int. Cl.
*G01R 31/28* (2006.01)
(52) U.S. Cl. .................................. 714/726; 714/724
(58) Field of Classification Search ................ 714/724, 714/726, 30, 733, 734, 729, 738, 718; 365/200, 365/201
See application file for complete search history.

(56) References Cited

U.S. PATENT DOCUMENTS 6,785,855 B2 * 8/2004 Zhang et al. ................ 714/731
7,246,287 B1 * 7/2007 Chua-Eoan et al. ......... 714/733

OTHER PUBLICATIONS

SAVIR, "Scan Latch Design for Delay Test", International Test Conference, 1997 IEEE, pp. 19.2, pp. 446-453.
Sankaralingam et al., "Inserting Test Points to Control Peak Power During Scan Testing", Proceedings of the 17th IEEE International Symposium on Defect and Fault Tolerance in VLSI Systems, 2002, IEEE, 9 pages.
Gerstendorfer et al., "Minimized Power Consumption for Scan-Based Bist", ITC International Test Conference, Paper 4.1, 1999 IEEE, pp. 77-84.
Huang et al., "Reduction of Power Consumption in Scan-Based Circuits during Test Application by an Input Control Technique", 2001 IEEE, vol. 20, No. 7, pp. 911-917.
Dervisoglu et al., "Design for Testability: Using Scanpath Techniques for Path-Delay Test and Measurement", International Test Conference, 1991 IEEE, Paper 14.1, pp. 365-374.
Abramovici et al., "Digital Systems Testing and Testable Design", Design for Testability, IEEE Press, 1990, pp. 358-417.

* cited by examiner

*Primary Examiner*—Phung M Chung
(74) *Attorney, Agent, or Firm*—Alford Law Group, Inc.; William E. Alford; Chui-Kiu Teresa Wong

(57) ABSTRACT

An improved scan register and methods of using the same have been disclosed. In one embodiment, the improved scan register includes a master latch having a data input, a data output, and a control input. The control input is coupled to a clock signal. The master latch is operable to store data. The improved scan register further includes a scan latch having a data input, a data output, and a control input. The data input of the scan latch is coupled to the data output of the master latch. The scan latch is operable to receive and to store the data from the master latch in response to the scan latch being in a scan mode. The improved scan register may further include a functional latch having a data input, a data output, and a control input. The data input of the functional latch is coupled to the data output of the master latch. The functional latch is operable to receive and to store the data from the master latch in response to the functional latch being in a functional mode. Other embodiments have been claimed and described.

20 Claims, 10 Drawing Sheets

(BACKGROUND)

SCAN REGISTER AND METHODS OF USING THE SAME

FIELD OF INVENTION

The present invention relates to semiconductor integrated circuits, and more particularly, to scan registers.

BACKGROUND

Scan registers (also known as scan flops or scan cells) are commonly used in integrated circuits (IC) to simplify the testing of manufactured IC chips. Scan registers are commonly used to enhance observability and/or controllability of a circuit during testing. Conventionally, a scan register is a register with both shift and parallel-load capability. The scan register may include a number of storage cells or latches to be used as observation points and/or control points.

An existing multiplexed-delay scan register is shown in FIG. 1. Referring to FIG. 1, the scan register 100 uses a Shift-Enable signal (SE) to configure the scan register 100 into a scan mode or a functional mode. The scan register 100 includes a multiplexer (MUX) 110, a master latch 120, a slave latch 130, and an inverter 140. In response to SE, the MUX 110 outputs either the scan-in data or the functional data as an input into the master latch 120. In response to the clock signal, the master latch 120 samples data from the MUX 110 on the negative edge of the clock signal and stores it therein on the positive edge of the clock signal during a clock cycle. That is, the master latch 120 samples data during low phase of the clock and stores data during the high phase of the clock. The master latch 120 then couples its output data into the slave latch 130. The inverter 140 inverts the clock signal into an inverted clock signal. The inverted clock signal is coupled to the slave latch 130 to control the sampling of data received from the master latch. In response to the inverted clock signal, the slave latch 130 samples data from the master latch 120 on the positive edge of the non-inverted clock signal and stores it therein on the negative edge of the non-inverted clock signal during a clock cycle. That is, the slave latch 130 samples data during high phase of the clock and stores data during the low phase of the clock. In this manner, the master latch can sample data while the slave latch stores data. Depending on whether the scan-in data or the functional data has been initially stored into the master latch 120 by way of the MUX 110, the slave latch 130 may drive out either the stored scan-in data or the stored functional data as Q/scan-out output.

A typical scan chain includes multiple scan registers, such as the scan register 100 in FIG. 1, coupled to each other in series. Test vectors can be shifted into the scan chain during the scan mode and the values stored in the scan registers in the scan chain are shifted out from the other end of the scan chain.

However, as the test vectors are shifted through the scan registers in the scan chain, the output of the scan registers change due to the 1's and 0's shifting through them. These changing values in the scan registers can cause excessive switching through the combinational logic network driven by the scan registers. This can draw excessive power and put extra strain on the power rails of the IC chip that may cause damage to the chip or invalidate test vectors due to voltage spikes affecting the state of registers. To reduce this impact, the test vectors are usually shifted in slowly.

One conventional solution to the above problem uses extra gating logic at the output of the scan register to reduce switching activity in the combinational logic network in scan mode during test. However, this solution adds extra delay in the scan register. Furthermore, enabling or disabling the scan mode in some existing scan registers can still cause excessive switching resulting in high peak power consumption. The additional logic may not be helpful in delay fault testing or system diagnosis using the scan registers.

Some existing techniques segmentize the scan registers into different scan chains and gate the clock signal for each of the scan chains differently to disable shifting the scan patterns through specific chains. However, this requires adding extra logic in a clock network that may complicate balancing the clock delay and minimizing clock skew across the IC chip. This technique also requires generation and reordering of the test vectors to allow some scan chains to disable their clock for portions of the test vectors.

SUMMARY

An improved scan register and methods of using the same have been disclosed. In one embodiment, the improved scan register includes a master latch having a data input, a data output, and a control input. The control input is coupled to a clock signal. The master latch is operable to store data. The improved scan register further includes a scan latch having a data input, a data output, and a control input. The data input of the scan latch is coupled to the data output of the master latch. The scan latch is operable to receive and to store the data from the master latch in response to the scan latch being in a scan mode. The improved scan register may further include a functional latch having a data input, a data output, and a control input. The data input of the functional latch is coupled to the data output of the master latch. The functional latch is operable to receive and to store the data from the master latch in response to the functional latch being in a functional mode Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following description, numerous specific details are set forth. However, it is understood that embodiments of the invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly couple and to indirectly couple through one or more intervening components.

Figure 1:
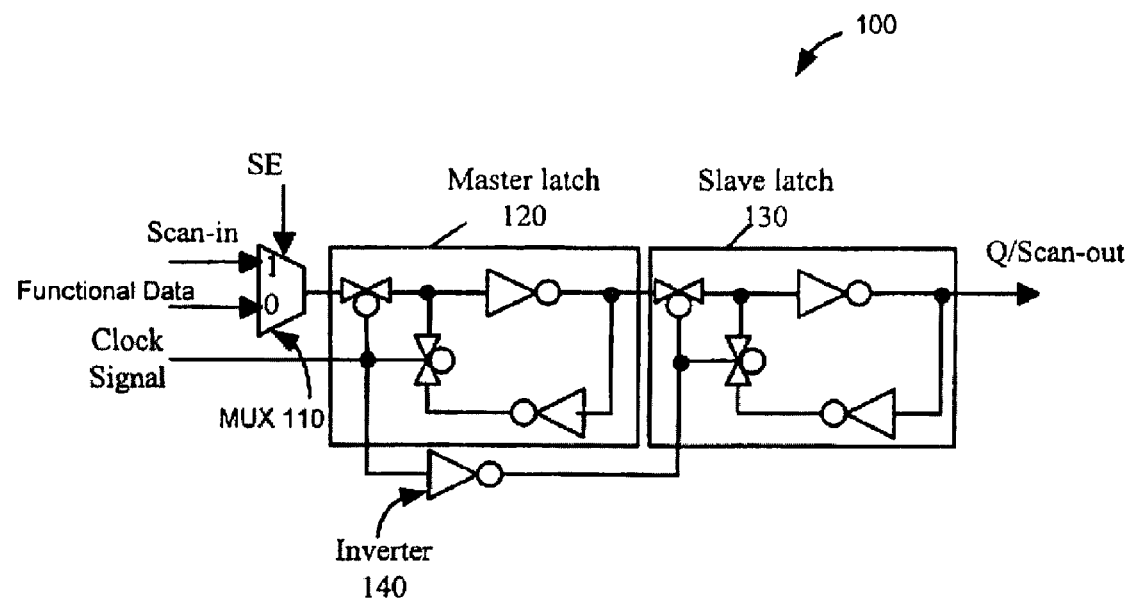
FIG. 1 illustrates a conventional multiplexed delay scan register.
Figure 2A:
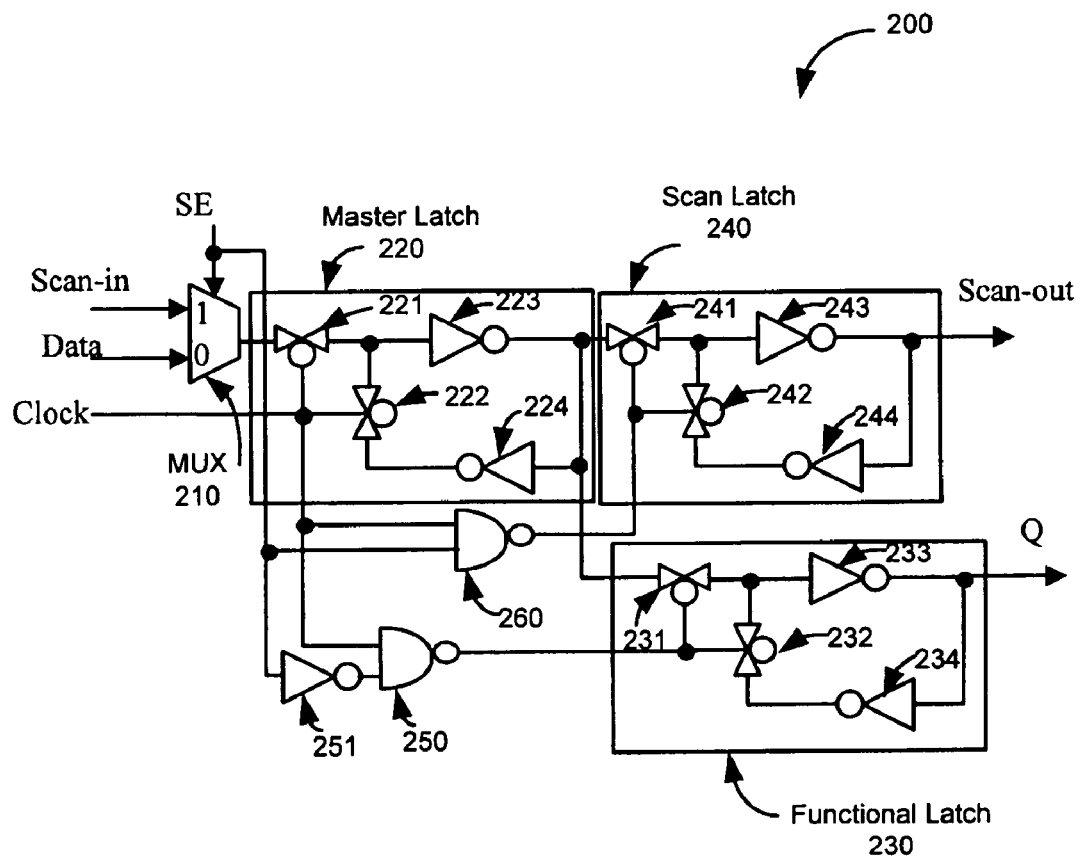
FIG. 2A illustrates one embodiment of an improved scan register.

FIG. 2A illustrates one embodiment of an improved scan register. The scan register 200 includes a multiplexer (MUX) 210, a master latch 220, a functional latch 230, a scan latch 240, an inverter 251, and two NAND gates 250 and 260. The master latch 220 receives data from the MUX 210 and outputs data to both the functional latch 230 and the scan latch 240. Both the functional latch 230 and the scan latch 240 may act as slave latches relative to the master latch 220. The functional latch 230 outputs the data from the master latch 220 when the scan register 200 is in a functional mode while the output of the scan latch 240 remains substantially steady. The scan latch 240 outputs the data from the master latch 220 when the scan register 200 is in a scan mode while the output of the functional latch 230 remains substantially steady. In one embodiment, the scan register 200 is in the functional mode when SE is low and the scan register 200 is in the scan mode when SE is high. Of course, it should be apparent that the scan register 200 may be modified in other embodiments such that the scan register 200 is in the scan mode when SE is low and the functional mode when SE is high. That is, the scan enable signal (SE) indicates whether the scan register and its latches are to be controlled in a scan mode or a functional mode.

In one embodiment, the MUX 210 respectively receives functional data, scan-in data, and a scan enable signal (SE) at the pair of data inputs and the control input of the MUX 210. In response to SE, the MUX 210 selectively outputs either the functional data or the scan data at the output of the MUX 210. For instance, the MUX 210 outputs the scan-in data when SE is high and may output the functional data when SE is low. The output of the MUX 210 is coupled to an input of the master latch 220.

In one embodiment, the master latch 220 includes two transmission gates 221 and 222 and two inverters 223 and 224 coupled together as illustrated in FIG. 2A. In one embodiment, the master latch 220 samples data from the MUX 210 on the negative edge of the clock signal and stores it on the positive edge of the clock signal. That is, the master latch 220 samples data from the MUX 210 during the low phase of the clock and stores data during the high phase of the clock. If the scan enable signal (SE) indicates a scan mode, the scan latch 240 samples data from the master latch 220 on the positive edge of the clock signal and stores it on the negative edge of the clock signal in one embodiment. That is in a scan mode, the scan latch 240 samples data from the master latch 220 during the high phase of the clock and stores data during the low phase of the clock in one embodiment. Alternatively if the scan enable signal (SE) indicates a functional mode, the functional latch 230 samples data from the master latch 220 on the positive edge of the clock signal and stores it on the negative edge of the clock signal in one embodiment. That is in a functional mode, the functional latch 230 samples data from the master latch 220 during the high phase of the clock and stores data during the low phase of the clock in one embodiment. In another embodiment of the invention, the phase of the clock with respect to the master latch and the phase of the clock with respect to the scan latch and the function latch may be reversed.

The data from the MUX 210 is gated by the transmission gate 221. The transmission gate 221 is activated and deactivated in response to the clock signal. A data input of the transmission gate 221 is coupled to a data output of the MUX 210. A control input of the transmission gate 221 is coupled to the clock signal. A data output of the transmission gate 221 is coupled to an input of the inverter 223 and a data output of the transmission gate 222.

The transmission gate 222 is deactivated and activated in response to the clock signal with respect to transmission gate 221. In one embodiment, the transmission gate 221 is turned on while the transmission gate 222 is turned off during the low phase of the clock and the transmission gate 221 is turned off while the transmission gate 222 is turned on during the high phase of the clock. The transmission gate 222 has a data output coupled to the input of inverter 223. A control input of the transmission gate 222 is coupled to the clock signal. A data input of the transmission gate 222 is coupled to the output of inverter 224. The transmission gate 222 forms a feedback path around inverter 223 with the inverter 224. Data passing through the transmission gate 221 may be inverted onto the output of the master latch 220 by inverter 223. The output of the master latch 220 is coupled into both the functional latch 230 and the scan latch 240. As discussed below, the data output from the master latch 220 may be inverted in the scan latch or the functional latch such that the polarity of data sampled by the master latch is preserved at the outputs of the scan latch and the functional latch. That is, the scan register may have an even number of data inversions in the data path so that the polarity of the data input is preserved at the data output.

In one embodiment, but for clocking control, each of the functional latch 230 and the scan latch 240 includes two transmission gates and two inverters coupled to each other in substantially the same manner as those in the master latch 220. Unlike the transmission gates 221 and 222 in the master latch 220, the transmission gates 231 and 232 in the functional latch 230 are gated by the output from the NAND gate 250. The control inputs of the transmission gates 231 and 232 are coupled to the output of the NAND gate 250. The output of the inverter 251 is coupled to one of the inputs of the NAND gate 250 while the input of the inverter is coupled to the SE signal. The inverter 251 generates an inverted scan enable (SE) signal. The NAND gate 250 receives the clock signal and the inverted SE signal as inputs. Thus, when the clock signal is high and SE is low ("inverted SE" is high), the NAND gate 250 outputs a low signal. In response to the low signal from the NAND gate 250, the transmission gate 231 is activated to sample the data from the master latch 220 and pass it into the functional latch 230. The output data from the master latch 220 may then be inverted and driven onto the output Q of the functional latch 230 via the inverter 233. Therefore, when SE is low, the scan register 200 is in a functional mode. The data at the output Q of the functional latch 230 is coupled to the input of inverter 234. The output of the inverter 234 is coupled to a data input of the transmission gate 232. As described above, the output of the NAND gate 250 is low in the functional mode, and thus, the transmission gate 232 is deactivated. When the output of the NAND gate 250 goes high, the transmission gate 232 is activated and as a result, the data at the output Q of the functional latch 230 can be stored therein.

Like the functional latch 230, the scan latch 240 includes a transmission gate 241 gating data from the master latch 220 into the scan latch 240. The transmission gates 241 and 242 are activated and deactivated in response to the output from the NAND gate 260. The NAND gate 260 receives the clock signal and the SE as inputs. Thus, when both the clock signal and SE are high, the NAND gate 260 outputs a low signal to activate the transmission gate 241, causing the transmission gate 241 to pass the data from the master latch 220 to the rest of the scan latch 240. The data from the master latch 220 may be inverted and driven onto the output of the scan latch 240, scan-out, via the inverter 243. Therefore, when SE is high, the scan register 200 is in a scan mode. The data at scan-out is coupled to the input of inverter 244. The output of the inverter 244 is coupled to the data input of the transmission gate 242. As described above, the output of the NAND gate 260 is low in the scan mode, and thus, the transmission gate 242 is deactivated. When the output of the NAND gate 260 goes high, the transmission gate 242 is activated and as a result, the data on scan-out can be stored in the scan latch 240.

In some embodiments, the output, Q of the functional latch 230 is coupled to a combinational logic network to output functional data to the combinational logic network. The output of the scan latch 240, scan-out, may be coupled to another scan register in a chain of scan registers or to a tester to output the scan-in data to the other scan registers or to the tester. When the functional data output via the Q output changes, the scan register 200 is in a functional mode, and scan-out remains substantially steady. Likewise, when scan-out changes, the scan register 200 is in a scan mode, and thus, the functional data output Q of the functional latch 230 remains substantially steady.

In one embodiment, the semiconductor device may run a scan test, which includes shifting a sequence of logic 1's and logic 0's through one or more scan registers. During the scan test, the scan-out switches between high and low in the scan mode while the functional data output Q to the combinational logic network remains substantially steady. Hence, unlike semiconductor devices incorporating conventional scan registers, switching of the combinational logic network may be reduced or avoided during testing and the switching of the scan-in data and the scan-out. By reducing the switching in the combinational logic network during the scan test, the power dissipated in the combinational logic network is significantly reduced. Furthermore, with reduced switching in the combinational logic network during the scan test, the scan-in data can be shifted at a higher speed to reduce test time and the associated test cost without adversely impacting the combinational logic network. The reduced switching during the scan test also reduces the possibility of supply voltage level fluctuations and signal-integrity problems during the scan test.

Figure 2B:
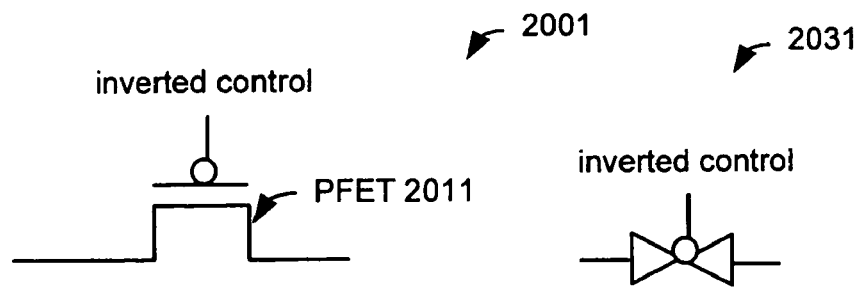
FIGS. 2B-2D illustrate exemplary embodiments of transmission gates.

FIG. 2B illustrates one embodiment of a transmission gate 2001 with a data input, a data output, and an active low control input referred to as "inverted control". The transmission gate 2001 includes a p-type Field Effect Transistor (PFET) 2011. The gate of PFET 2011 is coupled to the inverted control input. When the inverted control input is low, PFET 2011 is activated or turned on to pass data from a source of PFET 2011 (a data input) to a drain of PFET 2011 (a data output). A symbol 2031 of the transmission gate 2001 is as illustrated in FIG. 2B.

Figure 2C:
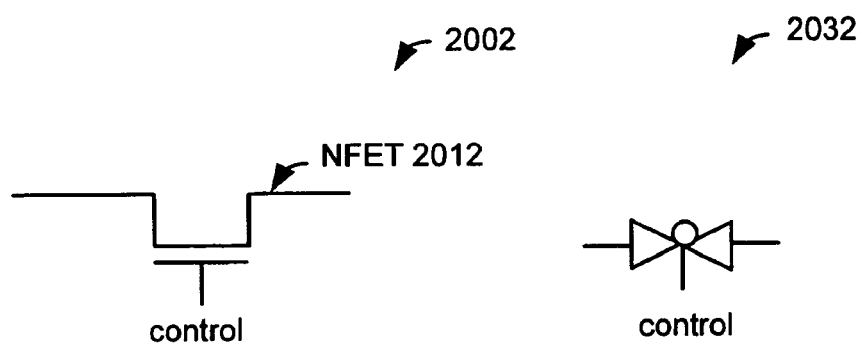

FIG. 2C illustrates one embodiment of a transmission gate 2002 with a data input, a data output and an active high control input referred to as "control". The transmission gate 2002 includes an n-type Field Effect Transistor (NFET) 2012. The gate of NFET 2012 is coupled to the control input. When the control input is high, NFET 2012 is activated or turned on to pass data from a source of NFET 2012 (a data input) to a drain of NFET 2012 (a data output). A symbol 2032 of the transmission gate 2002 is as illustrated in FIG. 2C.

Figure 2D:
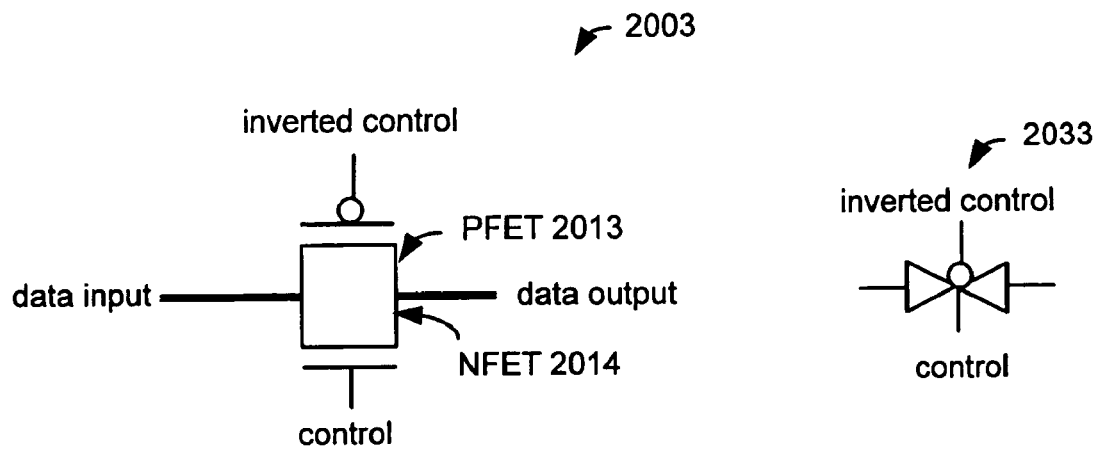

FIG. 2D illustrates one embodiment of a transmission gate with a data input, a data output, an active high control input referred to as "control", and an active low control input referred to as "inverted control". The transmission gate 2003 includes a PFET 2013 and an NFET 2014 coupled in parallel together. The sources of PFET 2013 and NFET 2014 (a data input) may be coupled together while the drains of PFET 2013 and NFET 2014 (a data output) may also be coupled together. The gate of NFET 2014 is coupled to a control signal. Unlike NFET 2014, the gate of PFET 2013 is coupled to the inverted control signal. Thus, when the control signal is high such that the inverted control signal is low, both NFET 2014 and PFET 2013 are activated to pass data from the data input to the data output. Conversely, when the control signal is low such that the inverted control signal is high, both NFET 2014 and PFET 2013 are deactivated to block the data. A symbol 2033 of the transmission gate 2003 is as illustrated in FIG. 2D.

Note that in some embodiments of the scan register 200, the transmission gates (e.g., 221, 222, 231, 232, etc.) may be implemented using the embodiment of transmission gate shown in FIG. 2C. In order to provide both the control signal and the inverted control signal, an inverter may be coupled to each of the clock signal, the output of the NAND gate 250, and the output of the NAND gate 260 to generate the corresponding inverted clock signal and inverted control signals.

Figure 3:
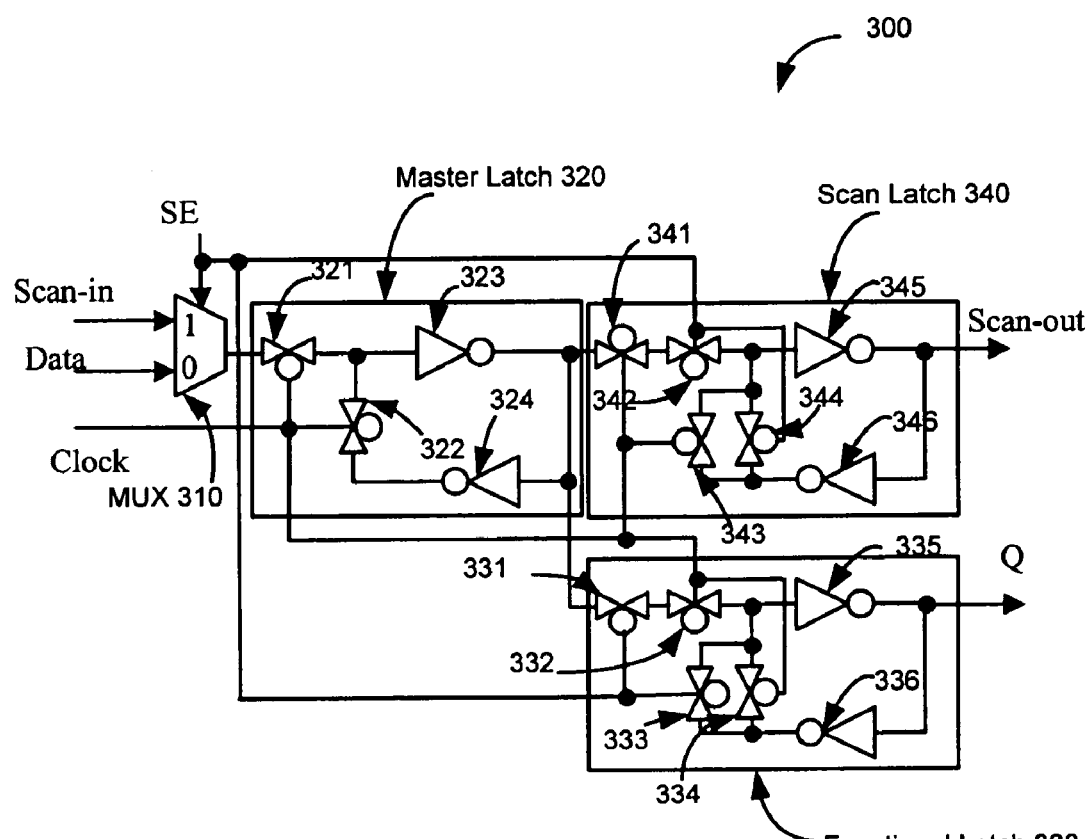
FIG. 3 shows an alternate embodiment of an improved scan register.

FIG. 3 illustrates an alternative embodiment of the improved scan register that incorporates the control logic into its latches. The scan register 300 includes a MUX 310, a master latch 320, a functional latch 330, and a scan latch 340. The master latch 320 receives data from the MUX 310 and outputs data to both the functional latch 330 and the scan latch 340. The functional latch 330 outputs the data from the master latch 320 when the scan register 300 is in a functional mode. Likewise, the scan latch 340 outputs the data from the master latch 320 when the scan register 300 is in a scan mode. In one embodiment, the scan register 300 is in the functional mode when SE is low and the scan register 300 is in the scan mode when SE is high. Of course, it should be apparent that the scan register 300 may be modified in other embodiments such that the scan register 300 is in the scan mode when SE is low and the functional mode when SE is high.

In one embodiment, the MUX 310 respectively receives functional data, scan-in data, and a Scan-Enable signal (SE) at the pair of data inputs and the control input of the MUX 310. In response to SE, the MUX 310 outputs either the functional data or the scan data at the output of the MUX 310. For instance, the MUX 310 outputs the scan-in data when SE is high and the functional data when SE is low. Thus, the scan register 300 is in a scan mode when SE is high and a functional mode when SE is low. The output of the MUX 310 is coupled to an input of the master latch 320.

In one embodiment, the master latch 320 includes two transmission gates 321 and 322 and two inverters 323 and 324 coupled together as illustrated in FIG. 3. The data from the MUX 310 is gated by the transmission gate 321, which is activated and deactivated in response to the clock signal. The transmission gate 322 is deactivated and activated in response to the clock signal with respect to transmission gate 321. The transmission gate 322 is coupled between an input of the inverter 323 and an output of the inverter 324. The transmission gate 322 forms a feedback path around inverter 323 with inverter 324. Data is passed through the transmission gate 321 and may be inverted at the output of the master latch 320 by the inverter 323. The output of the master latch 320 is coupled into both the functional latch 330 and the scan latch 340.

In one embodiment, the functional latch 330 includes four transmission gates 331-334 and two inverters 335 and 336 coupled together as shown in FIG. 3. The transmission gate 331 receives the data output from the master latch 320. In response to SE, the transmission gate 331 may pass or block the data from the master latch 320 to the rest of the functional latch 330. For example when SE is low, transmission gate 331 is activated and passes the data to the rest of the functional latch 330. Transmission gate 332 is coupled between the transmission gate 331 and the inverter 335. Transmission gate 332 passes and blocks the data from the transmission gate 331 in response to the clock signal. For example, the transmission gate 332 passes the data from the transmission gate 331 when the clock signal is high. When the clock signal is low, transmission gate 332 blocks data from the transmission gate 331.

In one embodiment, feedback paths around inverter 335 in the functional latch 330 includes inverter 336 and the transmission gates 333 and 334. The output of inverter 335 is coupled to the input of inverter 336. The output of inverter 336 is coupled to the input of each transmission gate 333 and 334. The outputs of both transmission gates 333 and 334 are coupled together and to the input of inverter 335. Data passing through the transmission gates 331 and 332 is inverted and driven onto the output of the inverter 335, Q, when the transmission gates 333 and 334 are deactivated. In one embodiment, the transmission gate 333 is deactivated when SE is low. In one embodiment, the transmission gate 334 is deactivated when the clock signal is high and activated when the clock signal is low. Thus, the data from the master latch 320 may be inverted and driven onto the output Q when the scan register 300 is in the functional mode and the clock signal is high.

In one embodiment, the scan latch 340 includes four transmission gates 341-344 and two inverters 345 and 346 coupled together as shown in FIG. 3. The transmission gate 341 receives the data output from the master latch 320. In response to the clock signal, the transmission gate 341 may pass or block the data from the master latch 320 to the rest of the scan latch 340. For example, when the clock signal is high, the transmission gate 341 passes the data to the rest of the scan latch 340 and when the clock signal is low, transmission gate 341 blocks data. Transmission gate 342 couples between the transmission gate 341 and the inverter 345. Transmission gate 342 passes and blocks the data from the transmission gate 341 in response to SE. For example, the transmission gate 342 passes the data from the transmission gate 341 to the inverter 345 when SE is high and blocks data from transmission gate 341 when SE is low.

Feedback paths are formed around inverter 345 and inverter 346 and the transmission gates 343 and 344 in the scan latch 340. The output of inverter 345 is coupled to the input of inverter 346. The output of inverter 346 is coupled to the inputs of each transmission gate 343 and 344. The outputs of both the transmission gates 343 and 344 are coupled together and to the input of the inverter 345. Data passing through the transmission gates 341 and 342 is inverted and driven onto the output of the inverter 345, scan-out when the transmission gates 343 and 344 are deactivated. In one embodiment, transmission gate 343 is deactivated when the clock signal is high and activated when the clock signal is low. In one embodiment, transmission gate 344 is deactivated when SE is high and activated when SE is low. Thus, the data from the master latch 320 may be inverted and driven onto the output scan-out when the scan register 300 is in the scan mode and the clock signal is high.

Note that the use of the transmission gates 331, 333, 344, and 342 in the functional latch 330 and the scan latch 340, respectively, replaces the NAND gates 250 and 260 in FIG. 2A. Since the delay through transmission gates is typically shorter than the delay through NAND gates, the use of the transmission gates 331, 333, 344, and 342 may improve the performance of the scan register 300.

As described above with reference to FIG. 2A, the improved scan register 300 may also be incorporated into a semiconductor device to enable the application of scan test on the semiconductor device. Some advantages of the improved scan register have been described above with reference to FIG. 2A.

Figure 4A:
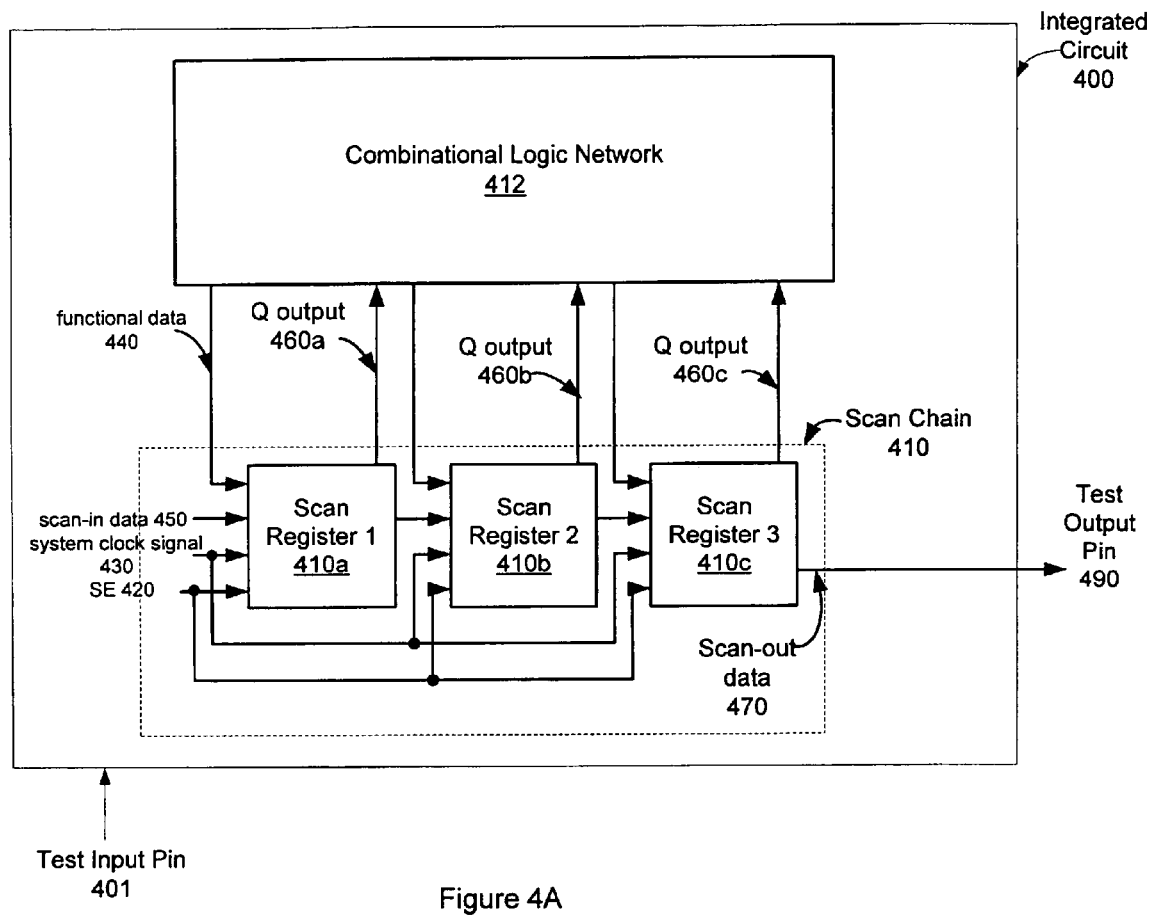
FIG. 4A illustrates an integrated circuit with a test input pin, a test output pin, and one embodiment of a scan chain.

FIG. 4A illustrates an integrated circuit 400 with a test input pin 401, a test output pin 490, and one embodiment of a scan chain. The scan chain 410 includes three scan registers 410a-410c coupled in series together and coupled in parallel to a combinational logic network 412. The first scan register 410a receives functional data 440 from the combinational logic network 412, scan-in data 450, a system clock signal 430, and a Scan-Enable (SE) signal 420. The functional data 440 from the combinational logic network 412, the system clock signal 430, and the SE 420 are also input to the other two scan registers 410b and 410c. The second scan register 410b receives scan-in data from the scan-out of the first scan register 410a. Likewise, the third scan register 410c receives scan-in data from the scan-out of the second scan register 410b. The first, second, and third scan registers 410a-410c may output functional data (Q output) 460a-460c, respectively, to the combinational logic network 412. The third scan register 410c may output the scan data (also referred to as the scan-out data 470) from its scan-out to a tester. Note that the functional data output and the scan-out data of each of the scan registers 410a-410c may be independent of each other. Details of various embodiments of the scan registers 410a-410c have been discussed above with reference to FIGS. 2 and 3. While three scan registers 410a-410c have been shown and described, it is understood that two or more scan registers may be used in a scan chain.

Figure 4B:
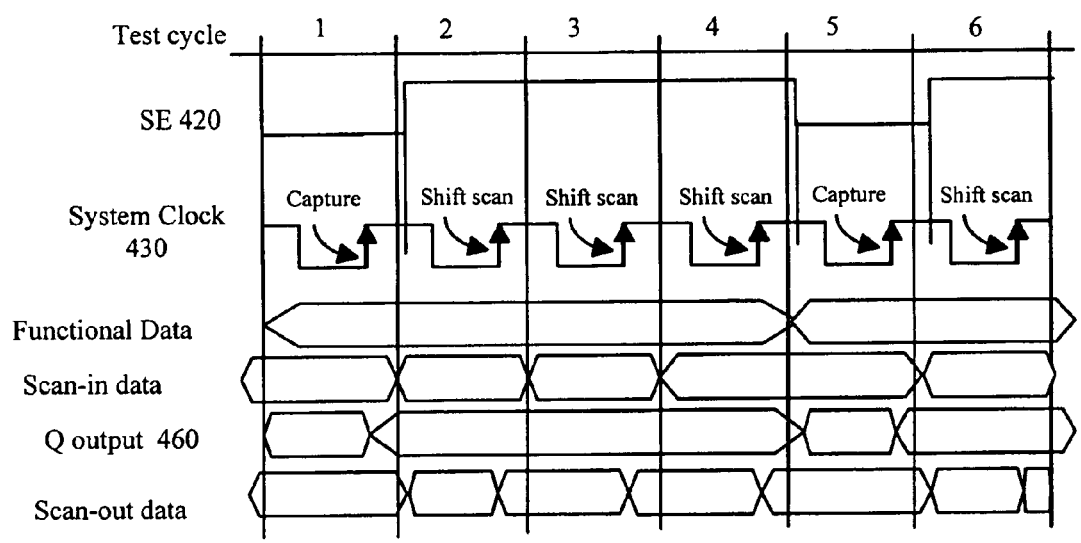
FIG. 4B illustrates a sample waveform of the scan chain shown in FIG. 4A according to one embodiment of the invention.

FIG. 4B illustrates a sample waveform of the scan chain 410 in FIG. 4A according to one embodiment of the invention. In the first "Capture" cycle (Test cycle 1), Scan-Enable (SE) 420 is asserted to logic 0, and system clock 430 is pulsed to capture the next state data into the scan registers 410a-410c in FIG. 4A. Next, SE 420 is asserted to logic 1 while the system clock 430 is still high (test cycle 2), thus enabling a scan shift operation. Each pulse on the system clock 430 shifts the data through the scan chain 410. However, since SE 420 is held high, the Q output 460 of the scan register 410c stays substantially steady at the last captured value. By holding the Q output 460 substantially steady at the last captured value, switching activity through the combinational logic network 412 driven by the Q output may be prevented or, at least, reduced.

In an alternative embodiment, a different number of shift cycles are used depending on the number of scan registers in the scan chain. Referring back to FIG. 4B, SE 420 is asserted to logic 0 while the system clock 430 is still high (test cycle 5). This updates the Q output 460 of the scan register 410c to the scanned vector state. A low pulse of the system clock signal 430 captures the vector response into the scan registers 410a-410c while a high pulse shifts it to the next. The capture and shift operations may be repeated to shift out the test data through the scan chain 410 and to shift-in the next test vector.

Figure 4C:
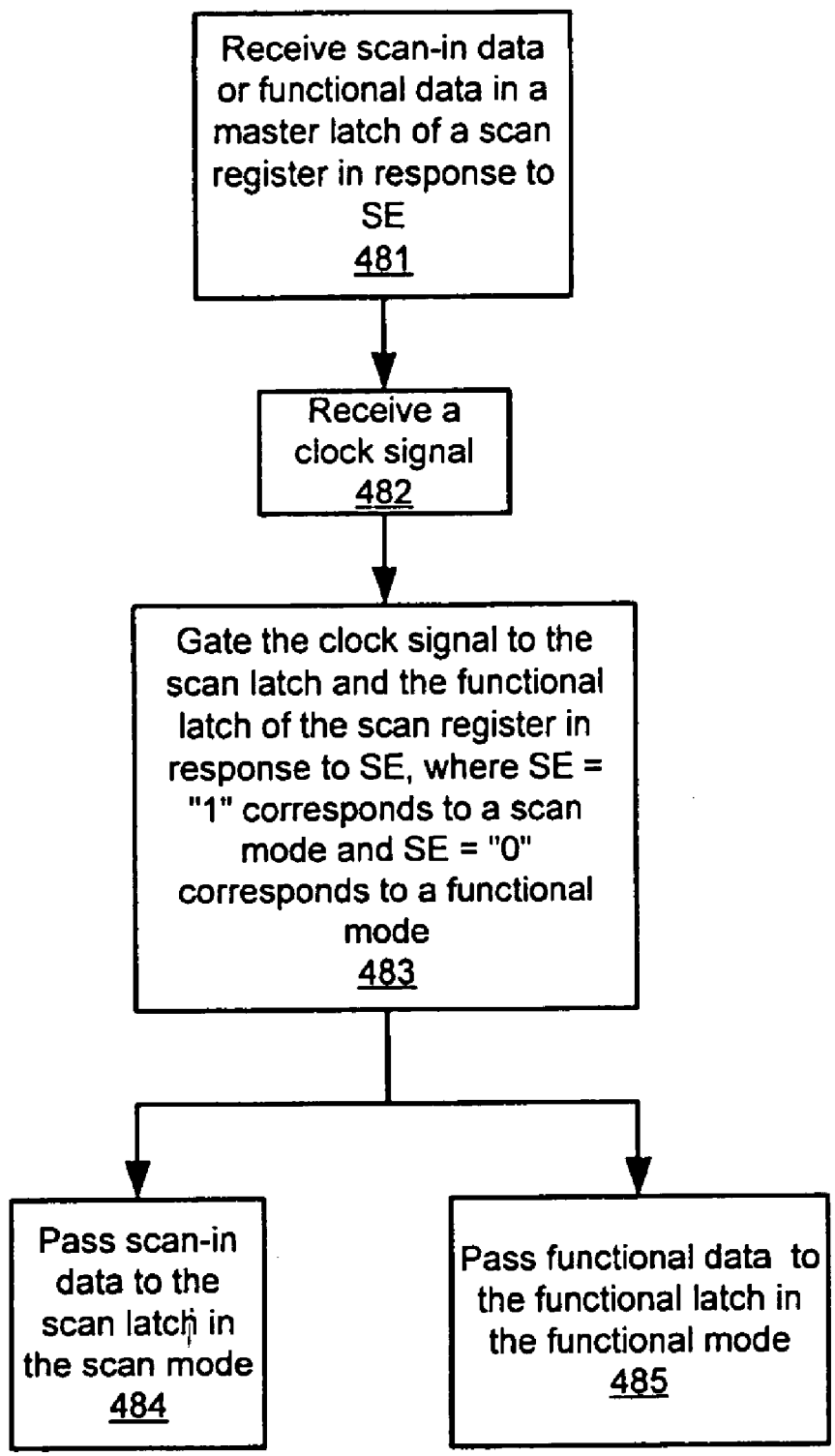
FIG. 4C shows a flow diagram of one embodiment of a process for using a scan register.

FIG. 4C shows a flow diagram of one embodiment of a process for using a scan register. At block 481, a master latch of a scan register receives scan-in data or functional data in response to a Scan-Enable signal (SE). At block 482, the master latch receives a clock signal. In block 483, the clock signal to a scan latch and a functional latch of the scan register is gated in response to SE. If SE is at logic 1, the scan register is in a scan mode. If SE is at logic 0, the scan register is in a functional mode. If the scan register is in the scan mode, the scan-in data is passed from the master latch to the scan latch in block 484. Likewise, if the scan register is in the functional mode, the functional data is passed from the master latch to the functional latch in block 485.

Figure 5A:
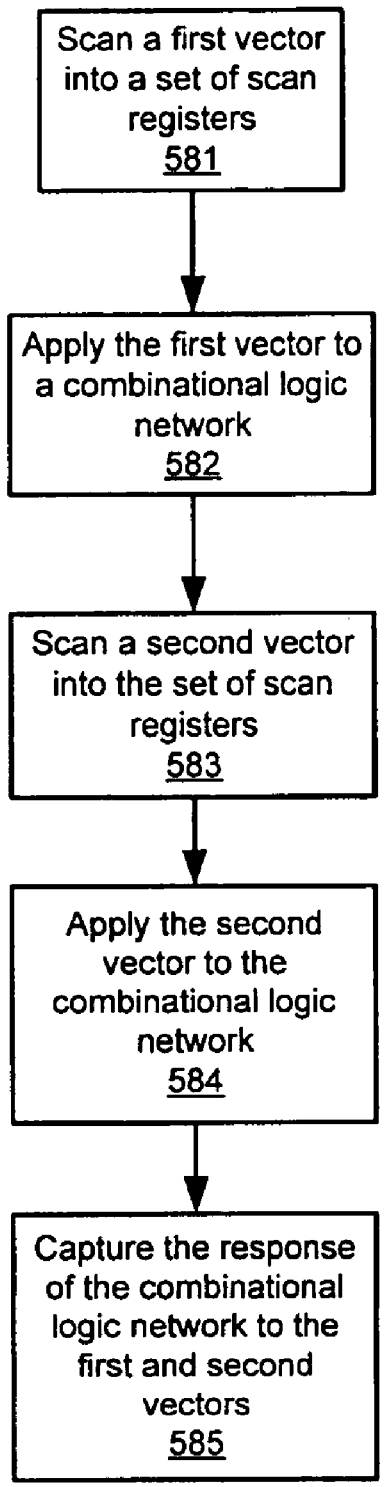
FIG. 5A shows a flow diagram of one embodiment of a process to deliver two patterns in a delay fault test on a combinational logic network using the improved scan registers.

FIG. 5A shows a flow diagram of one embodiment of a process to deliver two patterns in a delay fault test on a combinational logic network using the improved scan registers. At block 581, a first vector is scanned into a set of scan registers. The first vector may be scanned by enabling a scan mode of the scan registers first and shifting the first vector through the scan registers. At block 582, the first vector is applied to the combinational logic network. The first vector may be applied to the combinational logic network by disabling the scan mode or enabling the functional mode of the scan registers. In one embodiment, the first vector initializes the combinational logic network for the delay fault test.

At block 583, a second vector is scanned into the scan registers. The second vector may be scanned by enabling a scan mode of the scan registers and then shifting the second vector through the scan registers. At block 584, the second vector is applied to the combinational logic network. The second vector may be applied to the combinational logic network by disabling the scan mode or enabling the functional mode of the scan registers. In one embodiment, the second vector is applied to the combinational logic network to test the combinational logic network at the transition from the first vector to the second vector. At block 585, the response of the combinational logic network to the first and second test vectors is captured by pulsing the clock within the scan registers in functional mode.

Figure 5B:
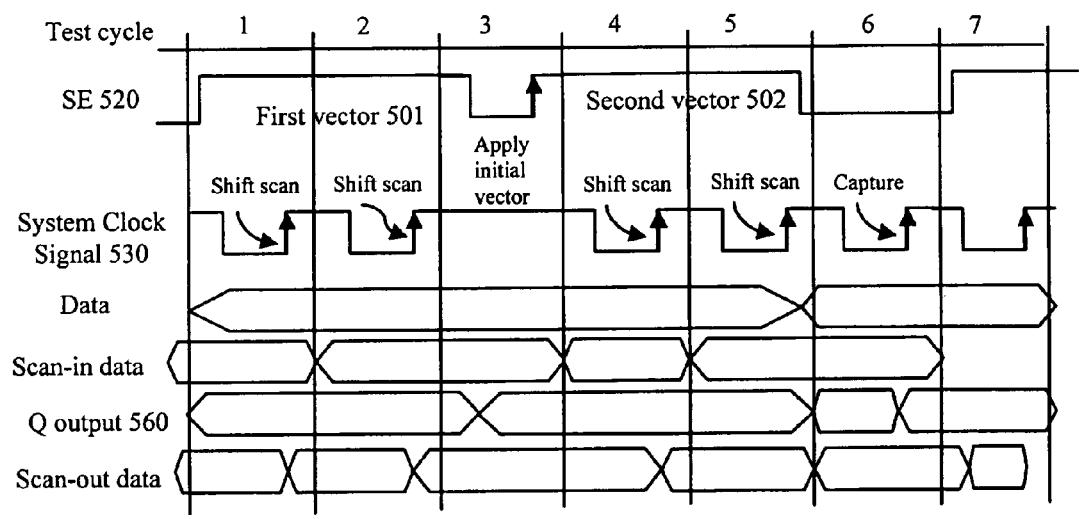
FIG. 5B shows a sample waveform for delivering two patterns in a delay fault test according to one embodiment of the invention.

FIG. 5B shows a sample waveform for delivering two patterns in a delay fault test on a circuit according to one embodiment of the invention. Each pattern may correspond to a test vector. Different embodiments of delay-fault test may require different number of test vectors, which may be referred to as "vectors," to be scanned in, such as 2, 3, 4, etc. In one embodiment, a first vector initializes the circuit, and a second vector launches the transition along the same signal path that is being tested for a delay fault.

Using some embodiments of the improved scan registers, a two-vector delay fault test can be easily performed by initially scanning in the first vector 501 (test cycles 1 and 2 in FIG. 5B). The system clock signal 530 is held high at the end of the scanning in the first vector 501 while SE 520 is pulsed to logic 0 to update the Q output 560 of the scan registers within the first vector 501 to initialize the circuit (test cycle 3 in FIG. 5B). The second vector 502 is then scanned in (test cycles 4 and 5). SE 520 is set to logic 0 at the end of the second shift cycle (i.e., test cycle 5), which loads the second vector 502 into the functional latches of the scan registers. The active edge of the clock signal 530 in the following capture cycle (i.e., test cycle 6) captures response of the circuit to the applied test. The response may be shifted out while the next test vector is scanned into the scan registers (test cycle 7).

In contrast, some conventional approaches generate the second vector through a capture cycle or shift off the scan chain by one cycle. Thus, embodiments of the present invention are more efficient and result in higher test quality because the approach discussed above may use fewer test vectors to accomplish the delay fault test.

Figure 6:
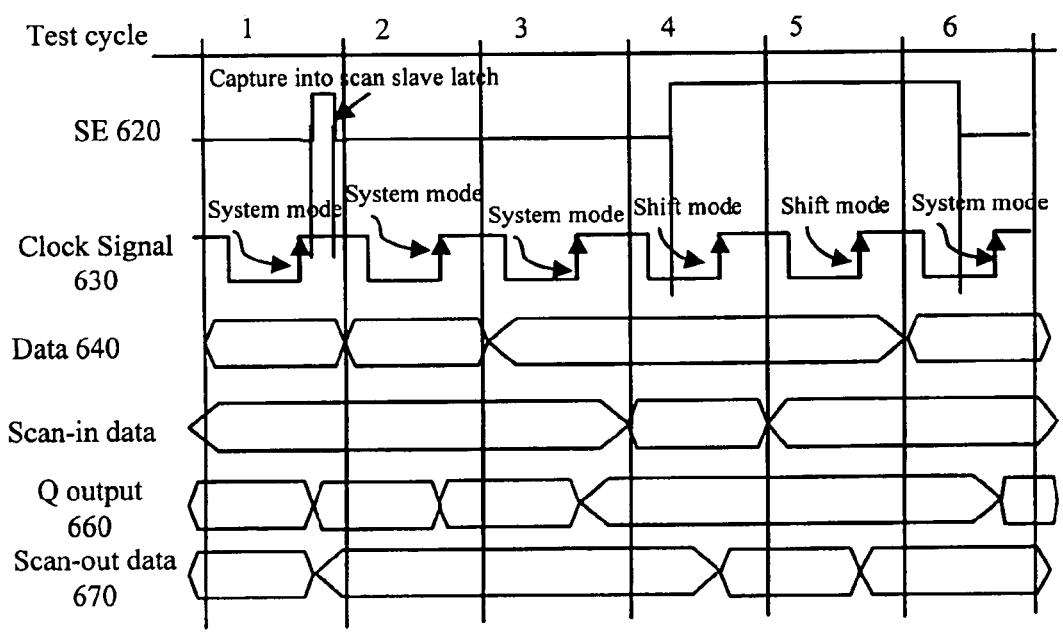
FIG. 6 shows a sample waveform for system diagnosis according to one embodiment of the invention.

FIG. 6 shows a sample waveform for system diagnosis according to one embodiment of the invention. In one embodiment, the improved scan register is used to perform system diagnosis on a circuit. SE 620 may be pulsed to capture the state of the circuit when the system clock 630 is high (test cycle 1 in FIG. 6). The captured state can be scanned out later. The capturing of the state of the circuit may be figuratively referred to as taking a "snapshot" of the state of the circuit. Since SE 620 is disabled substantially immediately after capturing the state, the data stored in the scan latch of the scan register may not be altered in the subsequent clock cycles (i.e., test cycles 2 and 3). At a predetermined moment, SE 620 is activated to scan out the state of scan latch of the scan register in order to shift out the stored diagnosis data (test cycles 4 and 5).

Note that as the scan data is being shifted out, the Q output 660 of the scan register retains its state, and hence, retaining the state of the circuit in a functional mode. After the diagnosis data has been scanned out, SE 620 can be deasserted to allow the circuit to continue to function from the last state (test cycle 6). SE 620 is deasserted when the system clock signal 630 is low to ensure that the Q output 660 of the scan register stays substantially unchanged. The next rising edge on the clock signal 630 may capture the next state in the functional mode, not in the scan mode.

In one embodiment, SE 620 is pulsed when the clock signal 630 is high to capture the data into the scan latch of the scan register. However, to enter or exit a shift operation, SE 620 is toggled when the clock signal 630 is low. This ensures that the scan and functional latches of the scan register do not change their data when SE 620 is toggled to enter or exit the shift operation. As shown in FIG. 6, the data 640 output by the system stays substantially steady during the shift mode, and the scan-out data 670 stays substantially steady during the functional mode.

One should appreciate that the applications of the improved scan registers described above are examples for illustrating the concept. The above examples are not intended to limit the application of the improved scan registers. One of ordinary skill in the art would be able to recognize from the above description that other applications of the improved scan registers in circuit testing are possible.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. An apparatus for scan testing of a semiconductor device, the apparatus comprising:

a master latch having a data input, a data output, and a control input, the control input being coupled to a clock signal, the master latch to store data in response to the clock signal;

a scan latch having a data input, a data output, and a first control input, the data input of the scan latch being coupled to the data output of the master latch, the scan latch to receive and to store data from the master latch in response to a scan enable signal indicating a scan mode; and a functional latch having a data input, a data output, and a first control input, the data input of the functional latch being coupled to the data output of the master latch, the functional latch to receive and to store data from the master latch in response to the scan enable signal indicating a functional mode.

2. The apparatus of claim 1, further comprising:
a multiplexer having a first input to receive scan data, a second input to receive functional data, a control input to receive the scan enable signal, and an output coupled to the data input of the master latch, the multiplexer to pass either the scan data or the functional data to the master latch in response to the scan enable signal respectively indicating the scan mode or the functional mode.

3. The apparatus of claim 2, further comprising:
a first gating logic circuit coupled to the first control input of the scan latch to gate the clock signal to the scan latch in response to the scan enable signal indicating the scan mode; and
a second gating logic circuit coupled to the first control input of the functional latch to gate the clock signal to the functional latch in response to the scan enable signal indicating the functional mode.

4. The apparatus of claim 3, wherein
the first gating logic circuit comprises a first NAND gate having a first input to receive the clock signal, a second input to receive the scan enable signal, and an output coupled to the control input of the scan latch, the first gating logic circuit to enable the scan latch to receive the scan data from the master latch in response to the scan enable signal indicating the scan mode, and
the second gating logic circuit comprises a second NAND gate having a first input to receive the clock signal, a second input to receive an inverted scan enable signal, and an output coupled to the control input of the functional latch, the second gating logic circuit to enable the functional latch to receive the functional data from the master latch in response to the scan enable signal indicating the functional mode.

5. The apparatus of claim 4, wherein circuitries of the scan latch and the functional latch are substantially similar.

6. The apparatus of claim 3, wherein the first gating logic circuit comprises a first plurality of transmission gates in the scan latch and the second gating logic circuit comprises a second plurality of transmission gates in the functional latch.

7. The apparatus of claim 1, wherein
the first control input couples to a clock signal, and
the functional latch includes
a second control input coupled to the scan enable signal;
a first transmission gate having a data input coupled to the data output of the master latch and a control input coupled to the second control input, the first transmission gate to receive and pass data in response to the scan enable signal indicating the functional mode;
a second transmission gate having a data input coupled to a data output of the first transmission gate and a control input coupled to the first control input of the functional latch, the second transmission gate to receive and pass data in response to the clock signal;
a third transmission gate having a control input coupled to the second control input and a data output coupled to a data output of the second transmission gate, the third transmission gate to receive and pass data in response to the scan enable signal indicating the scan mode;
a fourth transmission gate coupled in parallel to the third transmission gate, the fourth transmission gate having a control input coupled to the first control input and a data output coupled to the data output of the second transmission gate, the fourth transmission gate to receive and pass data in response to the clock signal;
a first inverter having an input coupled to the data output of the second transmission gate and an output coupled the data output of the functional latch, the first inverter to receive data and invert it at the output of the first inverter; and
a second inverter having an input coupled to the output of the first inverter and an output coupled to the to data inputs of the third and fourth transmission gates, the second inverter to receive data and invert it at the output of the second inverter.

8. The apparatus of claim 1, wherein
the first control input couples to a clock signal, and
the scan latch includes
a second control input coupled to the scan enable signal;
a first transmission gate having a data input coupled to the data output of the master latch and a control input coupled to the first control input, the first transmission gate to receive and pass data in response to the clock signal;
a second transmission gate having a data input coupled to a data output of the first transmission gate and a control input coupled to the second control input of the scan latch, the second transmission gate to receive and pass data in response to the scan enable signal indicating the scan mode;
a third transmission gate having a control input coupled to the second control input and a data output coupled to a data output of the second transmission gate, the third transmission gate to receive and pass data in response to the scan enable signal indicating the functional mode;
a fourth transmission gate coupled in parallel to the third transmission gate, the fourth transmission gate having a control input coupled to the first control input and a data output coupled to the data output of the second transmission gate, the fourth transmission gate to receive and pass data in response to the clock signal;
a first inverter having an input coupled to the data output of the second transmission gate and an output coupled the data output of the functional latch, the first inverter to receive data and invert it at the output of the first inverter; and
a second inverter having an input coupled to the output of the first inverter and an output coupled to the to data inputs of the third and fourth transmission gates, the second inverter to receive data and invert it at the output of the second inverter.

9. The apparatus of claim 1, wherein
the master latch, the scan latch, and the functional latch form a scan register of a plurality of scan registers coupled serially together.

10. The apparatus of claim 9, further comprising
a combinational logic circuit coupled to each functional latch of the plurality of scan registers; and
wherein the scan latch of a given scan register is coupled to the master latch of a next scan register to pass scan data while holding functional data at the functional latch substantially steady in a scan mode.

11. The apparatus of claim 10, further comprising
an input pin to couple to a tester to receive a plurality of test vectors in a delay default test, wherein the test vectors are scanned into the plurality of scan registers sequentially and then applied to the combinational logic circuit via the functional latch of each of the plurality of scan registers.

12. The apparatus of claim 10, further comprising
an output pin to couple to a tester to output a state of the combinational logic circuit captured by the plurality of scan registers and held in the scan latch of each of the plurality of scan registers.

13. A method for scan testing of a semiconductor device, the method comprising:
receiving scan data or functional data into a master latch of a first scan register in response to a scan enable signal indicating a scan mode or a functional mode, respectively;
passing the scan data from the master latch to a scan latch in the first scan register in response to the scan enable signal indicating the scan mode; and
passing the functional data from the master latch to a functional latch in the first scan register in response to the scan enable signal indicating the functional mode.

14. The method of claim 13, further comprising:
receiving a clock signal into the first scan register; and
gating the clock signal to the scan latch and the functional latch in response to the scan enable signal indicating the scan mode or the functional mode, respectively.

15. The method of claim 13, further comprising:
shifting a test vector including one or more bits through the scan latch in response to the scan enable signal indicating the scan mode; and
holding the functional data at an output of the functional latch substantially steady in response to the scan enable signal indicating the scan mode.

16. The method of claim 15, further comprising:
outputting the test vector from the scan latch to at least one of a second scan register and a tester.

17. The method of claim 13, further comprising:
pulsing the scan enable signal to capture a state of the first scan register in the scan latch when the clock signal is high;
saving the state in the scan latch; and
activating the scan enable signal to scan out the state from the scan latch after a predetermined period.

18. The method of claim 13, further comprising:
passing the scan data in the scan latch of the first scan register to a master latch of a second scan register.

19. The method of claim 13, further comprising:
applying the functional data to a combinational logic circuit coupled to the first scan register.

20. The method of claim 19, further comprising:
capturing a response of the combinational logic circuit in response to the functional data.

* * * * *